(12) United States Patent
Bennett et al.

(10) Patent No.: US 10,601,149 B2
(45) Date of Patent: Mar. 24, 2020

(54) WINDOW ASSEMBLY WITH CASING FOR SOLDER JOINT

(71) Applicants: AGC Automotive Americas R&D, Inc., Ypsilanti, MI (US); AGC Flat Glass North America, Inc., Alpharetta, GA (US)

(72) Inventors: Daniel D. Bennett, Tecumseh, MI (US); William C. Schuch, Adrian, MI (US)

(73) Assignee: AGC Automotive Americas R&D, Inc., Ypsilanti, MI (US)

( * ) Notice: Subject to any disclaimer, the term of this patent is extended or adjusted under 35 U.S.C. 154(b) by 740 days.

(21) Appl. No.: 14/912,256

(22) PCT Filed: Aug. 15, 2014

(86) PCT No.: PCT/US2014/051216
§ 371 (c)(1),
(2) Date: Feb. 16, 2016

(87) PCT Pub. No.: WO2015/023921
PCT Pub. Date: Feb. 19, 2015

(65) Prior Publication Data
US 2016/0204522 A1 Jul. 14, 2016

Related U.S. Application Data

(60) Provisional application No. 61/866,911, filed on Aug. 16, 2013.

(51) Int. Cl.
*H01R 4/28* (2006.01)
*H05K 3/40* (2006.01)
(Continued)

(52) U.S. Cl.
CPC ............. *H01R 4/28* (2013.01); *B23K 1/0008* (2013.01); *B23K 1/19* (2013.01); *H01R 4/02* (2013.01);
(Continued)

(58) Field of Classification Search
CPC .......... H01R 4/02; H01R 4/023; H01R 4/024; H01R 4/28; H01R 13/2414; H05B 1/0236;
(Continued)

(56) References Cited

U.S. PATENT DOCUMENTS 5,897,406 A * 4/1999 Benes .................... H01R 11/22
439/859
6,878,246 B2 4/2005 Latvaitis et al.
(Continued)

FOREIGN PATENT DOCUMENTS

GB 2 192 023 A 12/1987
JP S48078990 U 9/1973
(Continued)

OTHER PUBLICATIONS

English language abstract and machine-assisted English translation for JPS 48-078990 extracted from PAJ database on Jun. 18, 2018, 4 pages.
(Continued)

*Primary Examiner* — Ibrahime A Abraham
*Assistant Examiner* — John J Norton
(74) *Attorney, Agent, or Firm* — Howard & Howard Attorneys PLLC

(57) ABSTRACT

A window assembly (10) includes a transparent pane (18), an electrical conductor (20) contacting the transparent pane (18), an electrical connection element (22) for energizing the electrical conductor (20), an electrically conductive solder joint (28) disposed between the electrical connection ele-
(Continued)

ment (22) and the electrical conductor (20) for providing an electrical connection between the electrical connection element (22) and the electrical conductor (20), an encapsulation (26) over the electrical connection element (22) and the electrical conductor (20), and a casing (30) disposed between the encapsulation (26) and the electrical conductor (20) to prevent contact between the encapsulation (26) and the solder joint (28).

18 Claims, 3 Drawing Sheets

(51) Int. Cl.
| | |
|---|---|
| H05K 1/02 | (2006.01) |
| H05B 3/86 | (2006.01) |
| B23K 1/00 | (2006.01) |
| B23K 1/19 | (2006.01) |
| H01R 4/02 | (2006.01) |
| H01R 13/24 | (2006.01) |
| H05B 3/84 | (2006.01) |
| H05K 1/03 | (2006.01) |
| H05K 3/34 | (2006.01) |
| H05B 1/02 | (2006.01) |

(52) U.S. Cl.
CPC ....... *H01R 13/2414* (2013.01); *H05B 1/0236* (2013.01); *H05B 3/84* (2013.01); *H05B 3/86* (2013.01); *H05K 1/0212* (2013.01); *H05K 3/40* (2013.01); *H01R 2201/26* (2013.01); *H05B 2203/016* (2013.01); *H05K 1/0306* (2013.01); *H05K 3/3421* (2013.01); *H05K 2201/10356* (2013.01); *H05K 2201/10977* (2013.01)

(58) Field of Classification Search
CPC .......... H05B 3/84; H05B 3/86; H05K 1/0212; H05K 3/40; B23K 1/0008; B23K 1/19
See application file for complete search history.

(56) References Cited

U.S. PATENT DOCUMENTS

| | | | |
|---|---|---|---|
| 7,180,031 | B1 | 2/2007 | Loibl et al. |
| 7,270,548 | B2 | 9/2007 | Jenrich et al. |
| 7,510,401 | B2 | 3/2009 | Humpston et al. |
| 8,310,843 | B2 | 11/2012 | Kanatani et al. |
| 2004/0095284 | A1 | 5/2004 | Mueller et al. |
| 2007/0029301 | A1 | 2/2007 | Tokiwa et al. |
| 2012/0067641 | A1 | 3/2012 | Tokiwa et al. |
| 2012/0091113 | A1 | 4/2012 | Bennett et al. |
| 2012/0117880 | A1 | 5/2012 | Lahnala et al. |
| 2013/0052859 | A1 | 2/2013 | Ziegler et al. |
| 2013/0175255 | A1 | 7/2013 | Kim et al. |

FOREIGN PATENT DOCUMENTS

| | | |
|---|---|---|
| JP | S59110258 U | 7/1984 |
| JP | H01158662 U | 11/1989 |
| JP | 2001230616 A | 8/2001 |
| WO | 2008091016 A1 | 7/2008 |
| WO | WO 2009/015975 A1 | 2/2009 |
| WO | WO 2015/023936 A1 | 2/2015 |

OTHER PUBLICATIONS

English language abstract and machine-assisted English translation for JPS 59-110258 extracted from PAJ database on Jun. 18, 2018, 4 pages.
English language abstract and machine-assisted English translation for JPH 01-158662 extracted from PAJ database on Jun. 18, 2018, 4 pages.
English language abstract and machine-assisted English translation for JP 2001-230616 extracted from espacenet.com database on Jun. 18, 2018, 16 pages.
English language abstract for WO 2008/091016 extracted from espacenet.com database on Jun. 18, 2018, 1 page.
International Search Report for Application No. PCT/US2014/051250 dated Nov. 27, 2014, 3 pages.
International Search Report for Application No. PCT/US2014/051216 dated Nov. 27, 2014, 3 pages.

\* cited by examiner

WINDOW ASSEMBLY WITH CASING FOR SOLDER JOINT

CROSS-REFERENCE TO RELATED APPLICATION(S)

This application is the National Stage of International Patent Application No. PCT/US2014/051216, filed on Aug. 15, 2014, which claims priority to and all the advantages of U.S. Provisional Patent Application No. 61/866,911, filed on Aug. 16, 2013, the entire content of which is incorporated herein by reference.

BACKGROUND OF THE INVENTION

1. Field of the Invention

The present invention relates generally to window assemblies, and more specifically to a window assembly with a casing for a solder joint.

2. Description of the Related Art

Window assemblies for vehicles are often functionalized to include a transparent pane having an electrical conductor bonded to a connection element through a solder joint. The electrical conductor typically includes a printed silver circuit. The printed silver circuit is disposed on a surface of the transparent pane contained within the window assembly. Typically, power is transferred through a wire harness to the printed silver circuit. The wire harness has an electrical connection element which is electrically coupled to the printed silver circuit through the solder joint.

The window assembly is often further functionalized to include additional components, such as frames, rails or guides. When the window assembly includes additional components, an encapsulation may be utilized to attach these additional components to the window assembly. Typically, the encapsulation is made of a polymeric material disposed on the solder joint when the encapsulation is utilized to attach these additional components.

However, the window assembly is prone to a variety of unacceptable defects when the encapsulation is disposed on the solder joint. For example, the differences between the coefficients of thermal expansion of the solder joint, the transparent pane, and the encapsulation impart mechanical stress on the transparent pane, such that when the transparent pane is a glass pane, the glass pane is prone to cracking. The mechanical stress may also delaminate the printed silver circuit from the transparent pane or separate the solder joint from the printed silver circuit. Moreover, the mechanical stress may also crack the solder joint.

In another example, the encapsulation may permit water to contact the printed silver circuit near the solder joint. Water routinely penetrates through the encapsulation to contact the printed silver circuit near the solder joint. Water that has contacted the printed silver circuit near the solder joint is slow to evaporate because the water is disposed between the encapsulation and the printed silver circuit. As such, the water may corrode the printed silver circuit, thereby rendering the printed silver circuit inoperable. Accordingly, there remains an opportunity to develop an improved window assembly.

Accordingly, it is desirable to develop a window assembly that prevents the differences in the coefficients of thermal expansion between the transparent pane and the encapsulation from imparting a mechanical stress onto the transparent pane through the solder joint. It is also desirable to develop a window assembly that does not impart a mechanical stress onto a glass pane that may cause the glass pane to crack. Additionally, it would be desirable to develop a window assembly that does not impart a mechanical stress onto the transparent pane that may separate the connection element and the terminal connector, thereby severing the electrical connection between the electrical conductor and the power supply. Therefore, there is a need in the art for a window assembly that meets at least one of these desires.

SUMMARY OF THE INVENTION

Accordingly, the present invention provides a window assembly including a transparent pane and an electrical conductor contacting the transparent pane. The window assembly also includes an electrical connection element for energizing the electrical conductor and an electrically conductive solder joint between the electrical connection element and the electrical conductor for providing an electrical connection between the electrical connection element and the electrical conductor. The window assembly further includes an encapsulation over the electrical connection element and the electrical conductor and a casing disposed between the encapsulation and the electrical conductor to prevent contact between the encapsulation and the solder joint.

One advantage of the present invention is that a new window assembly is provided with a casing to isolate an encapsulation from a solder joint because the transparent pane typically has a lower coefficient of thermal expansion than the encapsulation, such as when the transparent pane is glass. Another advantage of the present invention is that the window assembly provides a casing that isolates the solder joint from the encapsulation, in which no mechanical stress is imparted onto the transparent pane through the solder joint. Yet another advantage of the present invention is that the window assembly includes a casing for the solder joint, resulting in the transparent pane not being prone to cracking or fracturing. Still another advantage of the present invention is that the window assembly includes a casing that seals the solder joint, preventing water from penetrating past the casing and contacting the solder joint. A further advantage of the present invention is that the window assembly includes a casing for a solder joint that is less prone to failure from mechanical stress and also less susceptible to corrosion.

Other features and advantages of the present invention will be readily appreciated, as the same become better understood, after reading the subsequent description taken in conjunction with the accompanying drawings.

DESCRIPTION OF THE PREFERRED EMBODIMENT(S)

Figure 1:
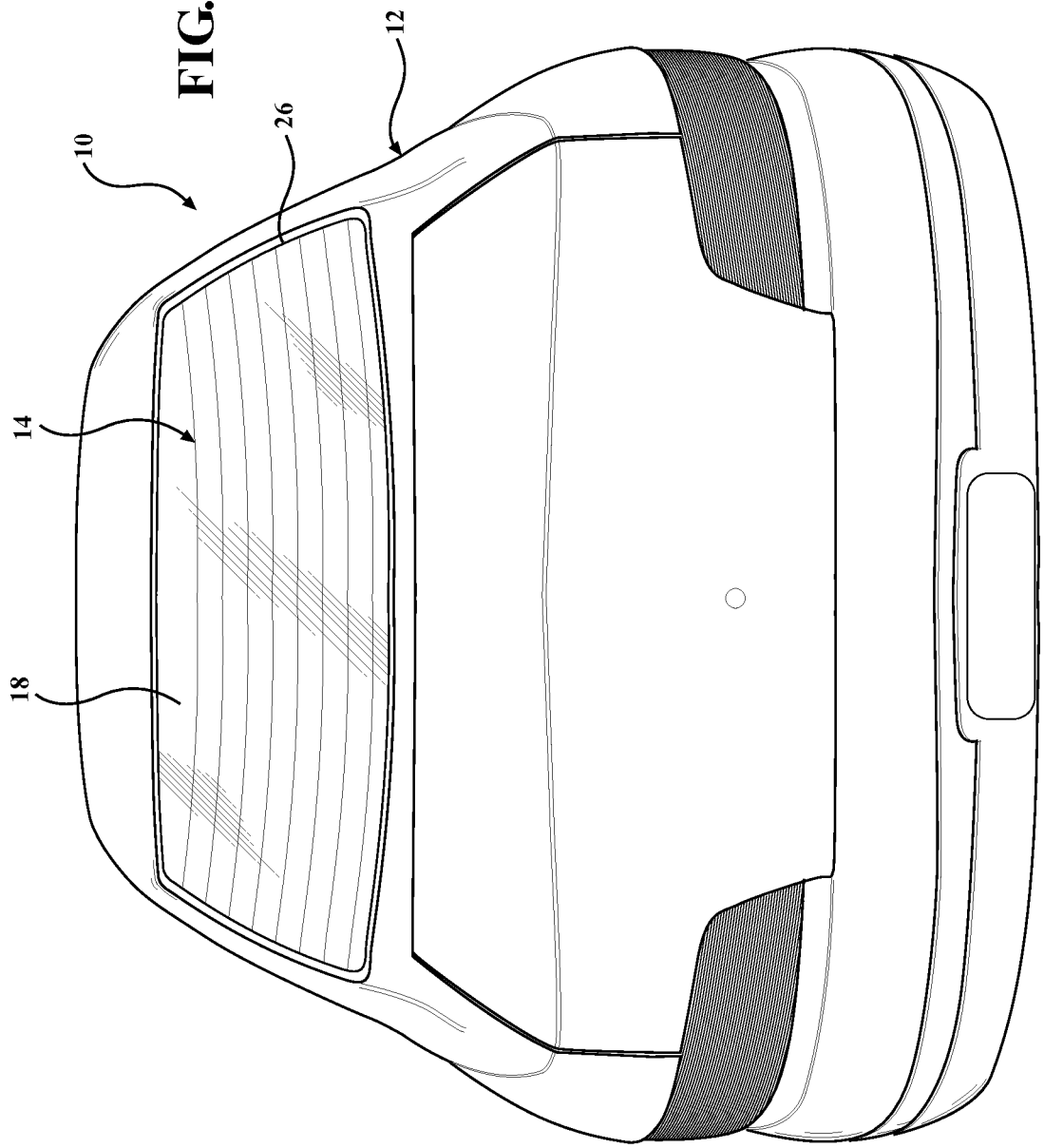
FIG. 1 is an elevational view of one embodiment of a window assembly, according to the present invention, illustrated in operational relationship with a vehicle.
Figure 2:
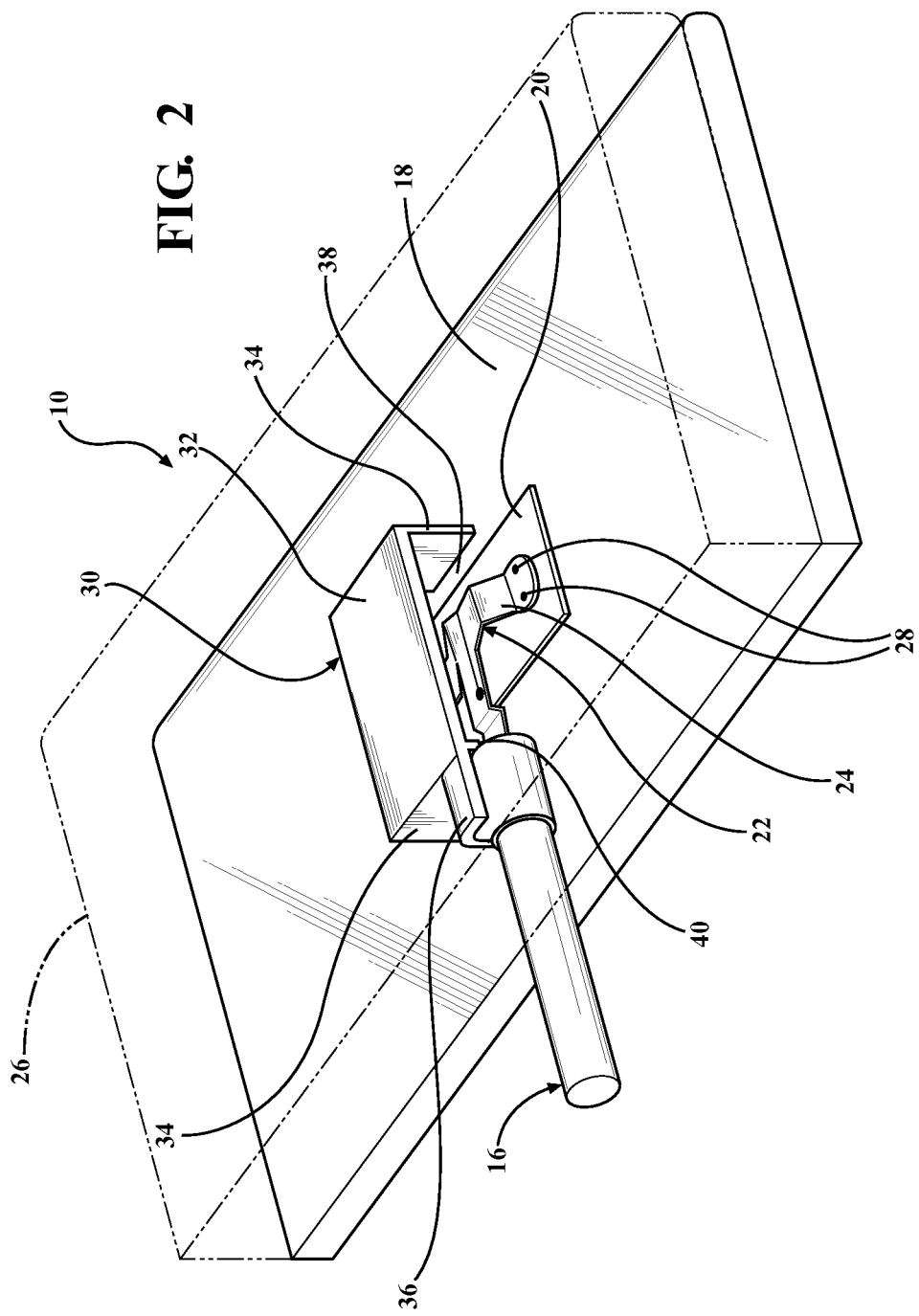
FIG. 2 is a partial cross sectional perspective view of the window assembly of FIG. 1 having a portion of a casing cut away.

Referring to the Figures, wherein like numerals indicate like parts throughout the several views, one embodiment of a window assembly 10, according to the present invention, is shown in FIGS. 1 and 2. The window assembly 10 is a typically for a vehicle, generally indicated at 12, such as an automotive vehicle. As illustrated in FIG. 1, the window assembly 10 may be a rear window assembly having a defrost system, generally indicated at 14. It should be appreciated that the window assembly 10 may be used for other types of vehicles providing a connection between a wiring harness, generally indicated at 16 (FIG. 2), and the defrost system 14 or other components such as an antenna (not shown).

Referring to FIGS. 1 and 2, one embodiment of the window assembly 10, according to the present invention, includes a transparent pane 18. In one embodiment, the transparent pane 18 is made of glass. In another embodiment, the transparent pane 18 is made of a polymethyl methacrylate, polycarbonate, polyvinyl butyral, and the like. The window assembly 10 also includes an electrical conductor 20. In one embodiment, the electrical conductor 20 is made of silver. In other embodiments, the electrical conductor 20 may be made of other conductive metals and/or other conductive or nonconductive materials in addition to, or instead of, silver. The electrical conductor 20 may be a film, a coating, and/or in any other form so long as the electrical conductor 20 is conductive and serves any function known in the art for such electrical conductors. The electrical conductor 20 may be porous and/or nonporous. In various embodiments, the electrical conductor 20 is a porous silver film. In other embodiments, the electrical conductor 20 may be printed, for example, a printed silver film or printed silver circuit. It should be appreciated that, although the electrical conductor 20 is shown to have a rectangular shape, the electrical conductor 20 may have any suitable shape.

In one embodiment, the electrical conductor 20 is disposed on the transparent pane 18 near a peripheral edge of the transparent pane 18. The electrical conductor 20 is often a component of a circuit, such as the defrost system 14, an antenna, a defogger, or the like. It should be appreciated that the electrical conductor 20 may be integral with the circuit or an extension of the circuit. The electrical conductor 20 may include one or more bus bars (not shown). It should be appreciated that the wire harness 16 transfers power from a power supply (not shown) to the electrical conductor 20.

The window assembly 10 also includes an electrical connection element, generally indicated at 22, that connects the wiring harness 16 and the electrical conductor 20 for electrically coupling and operatively connecting the electrical conductor 20 and the power supply. The connection element 22 is in electrical communication with the electrical conductor 20 for energizing the electrical conductor 20. In one embodiment, the connection element 22 may be of copper, a copper alloy, silver, a silver alloy, or combinations thereof. In other embodiments, the connection element 22 may also be of other metals in addition to or absent the metals described above, including, but not limited to, iron, molybdenum, tungsten, nickel, hafnium, tantalum, titanium, chromium, iridium, niobium, vanadium, platinum, tin, or combinations thereof. In one embodiment, the connection element 22 is copper. Typically, the connection element 22 includes a terminal connector 24 that is disposed at a distal end of the wiring harness 16. It should be appreciated that the connection element 22 may be of other conductive metals and/or other conductive or nonconductive material.

As illustrated in FIGS. 1 and 2, the window assembly 10 may include a layer or encapsulation 26 that encapsulates the peripheral edge of the window assembly 10. In one embodiment, the encapsulation 26 is made of a polymer or polymeric material. Non-limiting examples of the polymer include thermoplastic material(s) or thermoset material(s). Other non-limiting examples of the polymer include thermoplastic elastomers (TPE), thermoplastic vulcanizates (TPV), and thermoplastic polyolefins (TPO). Specific non-limiting examples include thermoplastic styrene (TPS), polyurethane, polyvinyl chloride (PVC), and ester based thermoplastic elastomers (E-TPE). It should be appreciated that, in one embodiment, the encapsulation 26 is formed from a reaction injection molding (RIM) process. It should also be appreciated that the encapsulation 26 may be made of non-polymeric materials.

The window assembly 10 may include one or more functional components (not shown) for aligning, positioning, or guiding the window assembly 10 on the vehicle 12. In one example, the functional component may be a rail for allowing the window assembly 10 to slide on a complementary rail attached to the vehicle 12. In another example, the functional component may be a frame for mounting the window assembly 10 to the vehicle 12. The encapsulation 26 attaches the functional components to the window assembly 10. To attach the functional component to the window assembly 10, the encapsulation 26 may encapsulate a portion of the functional component, thereby attaching the functional component to the window assembly 10.

In one embodiment, as specifically shown in FIGS. 2 through 5, the window assembly 10 includes a solder joint 28. The solder joint 28 connects the connection element 22 and the electrical conductor 20 for bonding and electrically coupling the electrical conductor 20 and the connection element 22. As illustrated in the figures, the connection element 22 may include the terminal connector 24. In one embodiment, the solder joint 28 may be between the electrical conductor 20 and the terminal connector 24. In another embodiment, the solder joint 28 may contact the electrical conductor 20 and the terminal connector 24 on an exterior surface of the connection element 22 and an exterior surface of the electrical conductor 20. As such, the solder joint 28 electrically couples and operatively connects the electrical conductor 20 to the power supply. The solder joint 28 is made from metals and/or alloys formed from lead, indium, tin, copper, silver, bismuth, germanium, gallium, gold, and/or other conductive metals and non-metals.

Figure 3:
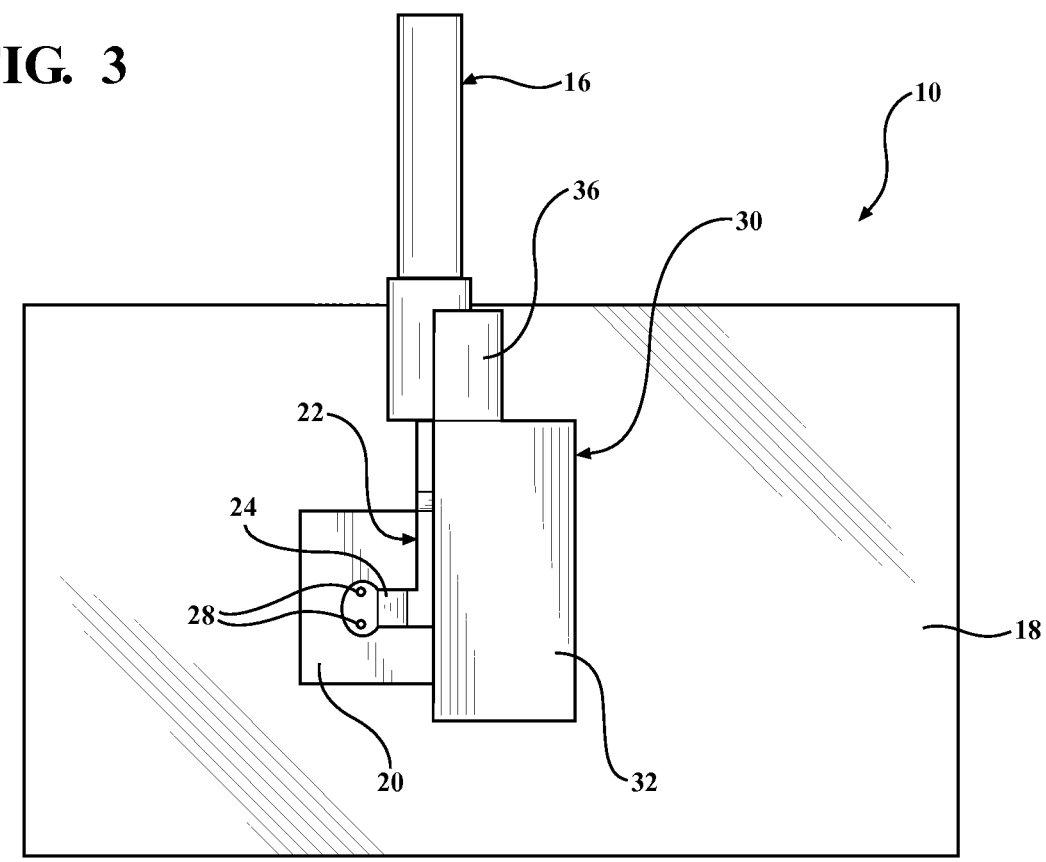
FIG. 3 is a planar top view of the window assembly of FIG. 2 illustrated without an encapsulation.
Figure 4:
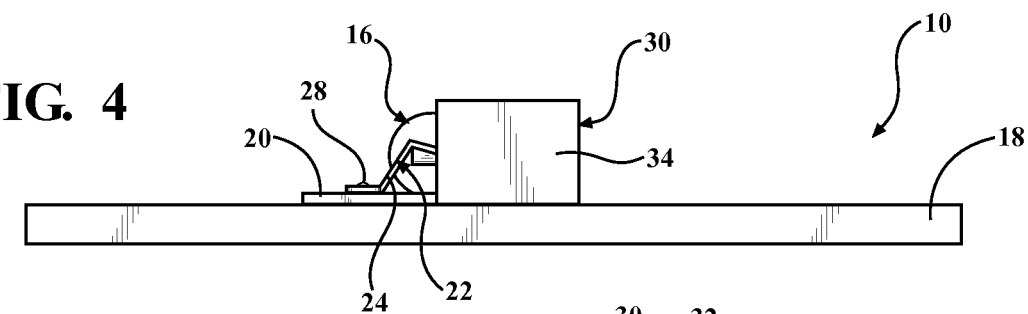
FIG. 4 is a front elevational view of the window assembly of FIG. 2 illustrated without an encapsulation.
Figure 5:
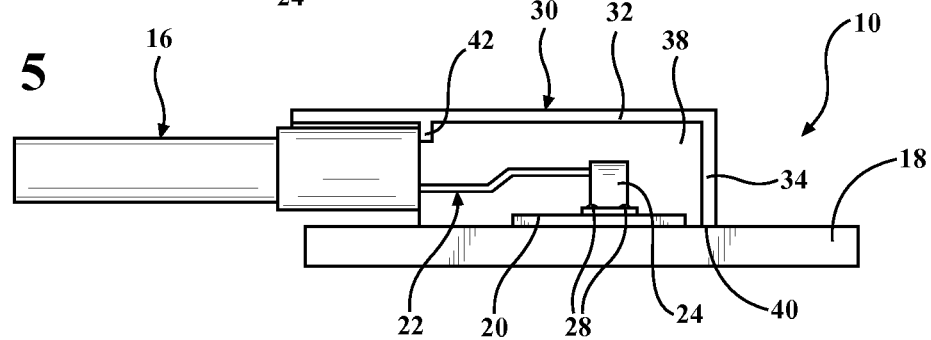
FIG. 5 is a side elevational view of the window assembly of FIG. 2 illustrated without an encapsulation.

In the embodiment illustrated, the window assembly 10 further includes a casing, generally indicated at 30, for isolating the solder joint 28 from the encapsulation 26 (not shown in FIGS. 3 through 5). Said differently, the casing 30 provides a physical barrier that surrounds the solder joint 28 and precludes contact between the solder joint 28 and the encapsulation 26. Notably, the casing 30 illustrated in FIGS. 2 through 5 has been partially removed so that the electrical conductor 20, the terminal connector 24, and the solder joint 28 are not obstructed from view in these figures. In the embodiment illustrated, the casing 30 is generally rectangular in shape. The casing 30 has a top wall 32 and side walls 34 extending downwardly from the top wall 32 to engage the transparent pane 18. The casing 30 has a tubular portion 36 extending from one of the side walls 34 to receive a portion of the wiring harness 16. It should be appreciated that the casing 30 can be any geometric shape so long as the geometric shape is sufficient to surround the solder joint 28, thereby providing a physical barrier that prevents contact between the encapsulation 26 and the solder joint 28.

Although the casing 30 surrounds the solder joint 28, a chamber or layer of air 38 exists between the solder joint 28 and the casing 30. The layer of air 38 prevents any stress that is imparted onto the casing 30 from the encapsulation 26 such that the stress is not transferred onto the solder joint 28 to prevent the transparent pane 18 from cracking. For example, the layer of air 38 prevents stress produced from differences in thermal expansion between the transparent pane 18 and the encapsulation 26 from being imparted onto the solder joint 28, because the solder joint 28 is not in contact with the encapsulation 26 or the casing 30. It should be appreciated that, when the transparent pane 18 is a glass pane, the layer of air 38 prevents a stress imparted on the casing 30 from the encapsulation 26 from being transferred onto the solder joint 28 to prevent the transparent pane 18 from cracking.

In one embodiment, the casing 30 is made of a polymeric material. The polymeric material may include thermoplastic polymers, thermoset polymers, or combinations thereof. Non-limiting examples of the polymeric material include silicones, nylons, polybutylene terephthalate, and the like. In one embodiment, an adhesive 40 may attach the casing 30 to the window assembly 10. Typically, the adhesive 40 attaches the casing 30 to the transparent pane 18, such that the casing 30 contacts the transparent pane 18. However, the adhesive 40 may also attach the casing 30 to the electrical conductor 20. Suitable adhesives are adhesives that provide adhesion to glass, such as pressure sensitive adhesives, urethanes, epoxies, acrylics, silicones, and the like.

In another embodiment, a mechanical mechanism may attach the casing 30 to the window assembly 10. In other words, the casing 30 may be geometrically configured to mechanically interlock with the connection element 22, with the wire harness 16, or both. For example, the casing 30 may be geometrically configured to snap fit over the connection element 22, the wiring harness 16, or both. In yet another embodiment, the casing 30 includes one or more attachment features 42 that locates and/or secures the casing 30 to the connection element 22, the wiring harness 16, or both.

The window assembly 10 of the present invention includes the casing 30, which is advantageous because the transparent pane 18 typically has a lower coefficient of thermal expansion than the encapsulation 26, such as when the transparent pane 18 is glass. As such, if the casing 30 was not present to isolate the encapsulation 26 and the solder joint 28 (i.e., the encapsulation 26 is in direct contact with the solder joint 28) the differences in the coefficients of thermal expansion between the transparent pane 18 and the encapsulation 26 will impart a mechanical stress onto the transparent pane 18 through the solder joint 28. Imparting a mechanical stress onto the transparent pane 18 may cause the transparent pane 18 to crack. Additionally, imparting a mechanical stress onto the transparent pane 18 may separate the electrical conductor 20 and the terminal connector 24, thereby severing the electrical connection between the electrical conductor 20 and the power supply. As such, because the casing 30 isolates the solder joint 28 from the encapsulation 26, no mechanical stress is imparted onto the transparent pane 18 through the solder joint 28. To this end, the solder joint 28 is not prone to failure because the differences in the thermal expansion between the transparent pane 18 and the encapsulation 26 do not impart a stress on the solder joint 28. Likewise, when the window assembly 10 of the present invention includes the casing 30, the transparent pane 18 is not prone to cracking or fracturing. In addition, because the casing 30 seals the solder joint 28, water is unable to penetrate past the casing and contact the solder joint 28. As such, not only is the solder joint 28 less prone to failure from mechanical stress, but the solder joint 28 is also less susceptible to corrosion.

The present invention has been described in an illustrative manner. It is to be understood that the terminology, which has been used, is intended to be in the nature of words of description rather than of limitation.

Many modifications and variations of the present invention are possible in light of the above teachings. Therefore, the present invention may be practiced other than as specifically described.

What is claimed is:

1. A window assembly comprising:
   a transparent pane;
   an electrical conductor contacting said transparent pane;
   an electrical connection element for energizing said electrical conductor;
   an electrically conductive solder joint between said electrical connection element and said electrical conductor for providing an electrical connection between said electrical connection element and said electrical conductor;
   an encapsulation over said electrical connection element and said electrical conductor and attached to said transparent pane; and
   a casing disposed between said encapsulation and said electrical conductor and surrounding said solder joint and contacting said encapsulation and said transparent pane to prevent contact between said encapsulation and said solder joint,
   wherein said casing is set apart in areas to form a layer of air between said encapsulation and said solder joint to prevent stress imparted on said casing from said encapsulation from being transferred to said solder joint to prevent said transparent pane from cracking.

2. The window assembly as set forth in claim 1 wherein said casing is made of a polymeric material.

3. The window assembly as set forth in claim 1 including an adhesive to attach said casing to said transparent pane.

4. The window assembly as set forth in claim 1 wherein said casing includes a projection to at least one of locate and secure said casing to said electrical connection element.

5. The window assembly as set forth in claim 1 wherein said electrical conductor comprises a printed silver circuit.

6. The window assembly as set forth in claim 1 wherein said transparent pane comprises a glass pane.

7. The window assembly as set forth in claim 1 wherein said encapsulation is made of a polymeric material.

8. A window assembly comprising:
   a transparent pane;
   an electrical conductor contacting said transparent pane;
   an electrical connection element including a terminal connector for electrical connection to said electrical conductor for energizing said electrical conductor;
   an electrically conductive solder joint between said terminal connector and said electrical conductor for providing an electrical connection between said terminal connector and said electrical conductor;
   an encapsulation disposed over said terminal connector and said electrical conductor and attached to said transparent pane; and
   a casing disposed between said encapsulation and said electrical conductor and surrounding said solder joint and contacting said encapsulation and said transparent pane to prevent contact between said encapsulation and said solder joint, wherein said casing is set apart in areas to form a layer of air between said encapsulation and said solder joint to prevent stress imparted on said casing from said encapsulation from being transferred to said solder joint to prevent said transparent pane from cracking.

9. The window assembly as set forth in claim 8 wherein said casing is made of a polymeric material.

10. The window assembly as set forth in claim 8 wherein said encapsulation is made of a polymeric material.

11. The window assembly as set forth in claim 10 wherein said transparent pane comprises a glass pane.

12. The window assembly as set forth in claim 11 wherein said electrical conductor comprises a printed silver circuit.

13. The window assembly as set forth in claim 10 wherein said transparent pane is made of a polymethyl methacrylate, polycarbonate, or polyvinyl butyral.

14. A vehicle including a window assembly as set forth in claim 1.

15. The vehicle as set forth in claim 14 wherein said window assembly is a rear window assembly.

16. The vehicle as set forth in claim 15 wherein said rear window assembly includes a defrost system.

17. A method of making a window assembly as set forth in claim 1 including the steps of:
providing an electrical connection between said electrical connection element and said electrical conductor by disposing said electrically conductive solder joint between said electrical connection element and said electrical conductor;
disposing said encapsulation over said electrical connection element and said electrical conductor; and
disposing said casing between said encapsulation and said electrical conductor and surrounding said solder joint and contacting said encapsulation and said transparent pane to prevent contact between said encapsulation and said solder joint, wherein said casing is set apart in areas to form a layer of air between said encapsulation and said solder joint to prevent stress imparted on said casing from said encapsulation from being transferred to said solder joint to prevent said transparent pane from cracking.

18. A window assembly comprising:
a transparent pane comprising a glass pane;
an electrical conductor comprising a printed silver circuit and contacting said glass pane;
an electrical connection element including a terminal connector for electrical connection to said electrical conductor for energizing said electrical conductor;
an electrically conductive solder joint between said terminal connector and said electrical conductor for providing an electrical connection between said terminal connector and said electrical conductor;
an encapsulation made of a polymeric material and disposed over said terminal connector and said electrical conductor and attached to said glass pane; and
a casing made of a polymeric material and disposed between said encapsulation and said electrical conductor and surrounding said solder joint and contacting said encapsulation and said glass pane to prevent contact between said encapsulation and said solder joint, wherein said casing is set apart in areas to form a layer of air between said encapsulation and said solder joint to prevent stress imparted on said casing from said encapsulation from being transferred to said solder joint to prevent said glass pane from cracking.

* * * * *